United States Patent
Cao et al.

(10) Patent No.: US 11,862,284 B2
(45) Date of Patent: Jan. 2, 2024

(54) SENSE AMPLIFIER, MEMORY AND DATA READOUT METHOD

(71) Applicant: CHANGXIN MEMORY TECHNOLOGIES, INC., Hefei (CN)

(72) Inventors: Kanyu Cao, Hefei (CN); Sungsoo Chi, Hefei (CN); WeiBing Shang, Hefei (CN); Ying Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 304 days.

(21) Appl. No.: 17/389,608

(22) Filed: Jul. 30, 2021

(65) Prior Publication Data

US 2022/0013152 A1   Jan. 13, 2022

Related U.S. Application Data

(63) Continuation of application No. PCT/CN2021/073804, filed on Jan. 26, 2021.

(30) Foreign Application Priority Data

Mar. 30, 2020   (CN) .......................... 202010237828.4

(51) Int. Cl.
   *G11C 7/08*   (2006.01)
   *G11C 7/12*   (2006.01)
(52) U.S. Cl.
   CPC . *G11C 7/08* (2013.01); *G11C 7/12* (2013.01)
(58) Field of Classification Search
   CPC .... G11C 7/08; G11C 7/12; G11C 7/06; G11C 7/10
   See application file for complete search history.

(56) References Cited

U.S. PATENT DOCUMENTS

| 6,326,815 B1 | 12/2001 | Sim |
| 6,426,657 B1 | 7/2002 | Miyatake |

(Continued)

FOREIGN PATENT DOCUMENTS

| CN | 108257631 A | 7/2018 |
| CN | 109841240 A | 6/2019 |

(Continued)

OTHER PUBLICATIONS

Supplementary European Search Report in the European application No. 21765813.7, dated Jun. 20, 2022, 8 pgs.

(Continued)

*Primary Examiner* — Han Yang
(74) *Attorney, Agent, or Firm* — Cooper Legal Group, LLC

(57) ABSTRACT

The present disclosure provides a sense amplifier, a memory, and a data readout method, and relates to the field of semiconductor memory technologies. The sense amplifier includes a first PMOS transistor, a second PMOS transistor, a first NMOS transistor, a second NMOS transistor, a first switch, a second switch, a third switch, and a fourth switch. During the offset compensation stage of the sense amplifier, the switching states of the first switch to the fourth switch are controlled so that the first NMOS transistor and the second NMOS transistor are configured to be in a cross-coupled amplification mode, and the first PMOS transistor and the second PMOS transistor are configured to be in a diode connection mode. The present disclosure enables to realize the offset compensation of the sense amplifier and improves the correctness of data readout by the memory.

17 Claims, 12 Drawing Sheets

(56) References Cited

U.S. PATENT DOCUMENTS

| | | | |
|---|---|---|---|
| 6,476,646 | B2 | 11/2002 | Sim |
| 6,483,353 | B2 | 11/2002 | Kim |
| 10,446,220 | B1 | 10/2019 | Guo |
| 2002/0003734 | A1* | 1/2002 | Kim .................. G11C 7/062 |
| | | | 365/201 |
| 2002/0008550 | A1 | 1/2002 | Sim |
| 2002/0050843 | A1 | 5/2002 | Kim |
| 2016/0093350 | A1 | 3/2016 | Jung et al. |
| 2017/0069368 | A1* | 3/2017 | Woo .................. G11C 11/4094 |
| 2019/0325941 | A1 | 10/2019 | Guo et al. |
| 2020/0035292 | A1 | 1/2020 | Guo et al. |
| 2021/0110863 | A1 | 4/2021 | Guo et al. |

FOREIGN PATENT DOCUMENTS

| | | |
|---|---|---|
| CN | 210575115 U | 5/2020 |
| CN | 211788182 U | 10/2020 |

OTHER PUBLICATIONS

International Search Report in the international application No. PCT/CN2021/073804, dated May 8, 2021, 2 pgs.
Brent Keeth. R. Jacob Baker, Brian Johnson. Feng Lin, "Dram Circuit Design Fundamental and High Speed Topics", Jan. 2008, Source: IEEE Xplore, IEEE Press Series on Microelectronic Systems, 377 pgs.

* cited by examiner

SENSE AMPLIFIER, MEMORY AND DATA READOUT METHOD

CROSS-REFERENCE TO RELATED APPLICATION

This is a continuation application of International Patent Application No. PCT/CN2021/073804, filed on Jan. 26, 2021, which claims priority to Chinese Patent Application No. 202010237828.4, entitled "SENSE AMPLIFIER, MEMORY AND DATA READOUT METHOD" and filed on Mar. 30, 2020. The contents of International Patent Application No. PCT/CN2021/073804 and Chinese Patent Application No. 202010237828.4 are hereby incorporated by reference in their entireties.

TECHNICAL FIELD

The present disclosure relates to the field of semiconductor memory technologies, and more particularly, to a sense amplifier, a memory, and a data readout method.

BACKGROUND

With the popularization of electronic devices such as mobile phones, tablets and personal computers, semiconductor memory technologies are also developed quickly. For example, memories such as the Dynamic Random Access Memory (DRAM) and Static Random-Access Memory (SRAM) have the advantages of high density, low power consumption, low price and the like, and have been widely applied to various electronic devices.

As an important part of the semiconductor memory, the sense amplifier mainly functions to amplify a small signal on a bit line, thereby executing a read or write operation.

However, a problem of read and write errors may occur due to defects inside the sense amplifier or influences from the environment. For example, the data stored in the memory cell is "1", but the data read from the bit line is "0". In this way, the performance of the semiconductor memory is seriously affected.

It is to be noted that the information disclosed in the above background section is merely intended to enhance understanding of the background of the present disclosure, and thus may include information that does not constitute the related art that is already known to a person of ordinary skill in the art.

SUMMARY

The present disclosure is intended to provide a sense amplifier, memory, and data readout method that overcomes, at least in part, the problem of memory read data errors due to limitations and disadvantages of the related art.

According to a first aspect of the present disclosure, there is provided a sense amplifier including: a first positive channel metal oxide semiconductor (PMOS) transistor, a gate of the first PMOS transistor being connected to a first bit line; a second PMOS transistor, a gate of the second PMOS transistor being connected to a second bit line, and a source of the second PMOS transistor being connected to a source of the first PMOS transistor, where the second bit line is an inverse bit line corresponding to the first bit line; a first negative channel metal oxide semiconductor (NMOS) transistor, a gate of the first NMOS transistor being connected to a drain of the second PMOS transistor, and a drain of the first NMOS transistor being connected to a drain of the first PMOS transistor; and a second NMOS transistor, a gate of the second NMOS transistor being connected to the drain of the first PMOS transistor, a drain of the second NMOS transistor being connected to the drain of the second PMOS transistor, and a source of the second NMOS transistor being connected to a source of the first NMOS transistor, where during an offset compensation stage of the sense amplifier, the first PMOS transistor and the second PMOS transistor are configured to be in a diode connection mode, and the first NMOS transistor and the second NMOS transistor are configured to be in a cross-coupled amplification mode.

According to some embodiments, during a pre-amplification stage of the sense amplifier, the first PMOS transistor and the second PMOS transistor are configured to be in a signal to be amplified receiving mode for receiving the signal to be amplified, the signal to be amplified being generated by charge sharing between charges in a parasitic capacitor of the first bit line or the second bit line and charges in a corresponding memory cell; and the first NMOS transistor and the second NMOS transistor are configured in the cross-coupled amplification mode.

According to some embodiments, during a write-back stage of the sense amplifier, the first PMOS transistor and the first NMOS transistor are configured as a first inverter, and the second PMOS transistor and the second NMOS transistor are configured as a second inverter; and where the first inverter and the second inverter are configured to be in a latch mode.

According to some embodiments, the sense amplifier further includes: a first switch, a first end of the first switch being connected to the drain of the first PMOS transistor, and a second end of the first switch being connected to the gate of the first PMOS transistor; a second switch, a first end of the second switch being connected to the drain of the second PMOS transistor, and a second end of the second switch being connected to the gate of the second PMOS transistor; a third switch, a first end of the third switch being connected to the first end of the first switch, and a second end of the third switch being connected to the second end of the second switch; and a fourth switch, a first end of the fourth switch being connected to the first end of the second switch, and a second end of the fourth switch being connected to the second end of the first switch.

According to some embodiments, during the offset compensation stage of the sense amplifier, the first switch and the second switch are closed, and the third switch and the fourth switch are open; during the pre-amplification stage of the sense amplifier, the first switch, the second switch, the third switch and the fourth switch are all open; and during the write-back stage of the sense amplifier, the first switch and the second switch are open, and the third switch and the fourth switch are closed.

According to some embodiments, the sense amplifier further includes: a pull-up unit, configured to connect the source of the first PMOS transistor to a power supply voltage in response to a pull-up control signal; and a pull-down unit, configured to ground the source of the first NMOS transistor in response to a pull-down control signal.

According to some embodiments, the pull-up unit includes a pull-up PMOS transistor, a gate of the pull-up PMOS transistor being configured to receive the pull-up control signal, a source of the pull-up PMOS transistor being connected to the power supply voltage, and a drain of the pull-up PMOS transistor being connected to the source of the first PMOS transistor; and the pull-down unit includes a pull-down NMOS transistor, a gate of the pull-down NMOS transistor being configured to receive the pull-down control signal, a source of the pull-down NMOS transistor being grounded, and a drain of the pull-down NMOS transistor being connected to the source of the first NMOS transistor.

According to some embodiments, the sense amplifier further includes: a first precharge unit, configured to, in response to a precharge control signal, precharge the source of the first PMOS transistor and the source of the first NMOS transistor in a case where the first switch, the second switch, the third switch and the fourth switch are all closed; and a second precharge unit, configured to, in response to the precharge control signal, precharge the first bit line and the second bit line in the case where the first switch, the second switch, the third switch and the fourth switch are all closed.

According to some embodiments, the sense amplifier further includes a switch control unit, configured to control switching states of the first switch, the second switch, the third switch and the fourth switch in response to a control signal.

According to some embodiments, the sense amplifier further includes: a fifth switch, a first end of the fifth switch being connected to the second end of the third switch, and a second end of the fifth switch being connected to the second bit line; and a sixth switch, a first end of the sixth switch being connected to the second end of the fourth switch, and a second end of the sixth switch being connected to the first bit line.

According to some embodiments, a type of the first switch is a PMOS transistor, an NMOS transistor or a complementary metal oxide semiconductor (CMOS) transmission gate; a type of the second switch is a PMOS transistor, an NMOS transistor, or a CMOS transmission gate; a type of the third switch is a PMOS transistor, an NMOS transistor, or a CMOS transmission gate; a type of the fourth switch is a PMOS transistor, an NMOS transistor, or a CMOS transmission gate; a type of the fifth switch is a PMOS transistor, an NMOS transistor, or a CMOS transmission gate; and a type of the sixth switch is a PMOS transistor, an NMOS transistor, or a CMOS transmission gate.

According to a second aspect of the present disclosure, there is provided a memory including the sense amplifier as described above.

According to a third aspect of the present disclosure, there is provided a data readout method applied to any one of the foregoing sense amplifiers. The data readout method includes that: the sense amplifier is precharged; an offset compensation voltage of the sense amplifier is determined and the offset compensation voltage is stored in a parasitic capacitor of a bit line, to perform offset compensation on the sense amplifier; charge sharing between charges in the parasitic capacitor and charges in a memory cell is performed to generate a signal to be amplified; and the signal to be amplified is amplified and an amplified signal is output to implement readout of data from the memory cell.

According to some embodiments, the operation of precharging the sense amplifier includes that: the first switch, the second switch, the third switch and the fourth switch are controlled to be in a closed state, and the first bit line, the second bit line, the source of the first PMOS transistor and the source of the first NMOS transistor are precharged.

According to some embodiments, the operation of storing the offset compensation voltage of the sense amplifier in the parasitic capacitor of the bit line includes that: the first switch and the second switch are controlled to be in a closed state; the third switch and the fourth switch are controlled to be in an open state; the source of the first PMOS transistor is controlled to be connected to the power supply voltage; and the source of the first NMOS transistor is controlled to be grounded.

According to some embodiments, the operation of performing charge sharing between charges in the parasitic capacitor and charges in the memory cell includes that: the source of the first PMOS transistor and the source of the first NMOS transistor are controlled to be charged to a precharge potential; and the first switch, the second switch, the third switch and the fourth switch are controlled to be in an open state, herein, in a case where the memory cell reads out the charges in response to a turn-on signal for the word line, charge sharing between the charges in the parasitic capacitor and the charges in the memory cell is performed.

According to some embodiments, the operation of amplifying the signal to be amplified and outputting the amplified signal includes that: a first step, the source of the first PMOS transistor is controlled to be connected to the power supply voltage, the source of the first NMOS transistor is controlled to be grounded, and the first switch, the second switch, the third switch and the fourth switch are controlled to be in an open state; and a second step, the third switch and the fourth switch are controlled to be in a closed state.

According to some embodiments, the operation of amplifying the signal to be amplified and outputting the amplified signal includes that: the source of the first PMOS transistor is controlled to be connected to the power supply voltage, and the source of the first NMOS transistor is controlled to be grounded; and the first switch and the second switch are controlled to be in an open state, and the third switch and the fourth switch are controlled to be in a closed state.

According to some embodiments, the operation of controlling the third switch and the fourth switch to be in the closed state includes that: voltages at control terminals of the third switch and the fourth switch are controlled to gradually reduce ON resistances of the third switch and the fourth switch.

According to some embodiments, the sense amplifier further includes a fifth switch and a sixth switch; a first end of the fifth switch being connected to the second end of the third switch, a second end of the fifth switch being connected to the second bit line; a first end of the sixth switch being connected to the second end of the fourth switch, and a second end of the sixth switch being connected to the first bit line. The operation of amplifying the signal to be amplified and outputting the amplified signal includes that: a first step, the source of the first PMOS transistor is controlled to be connected to the power supply voltage, the source of the first NMOS transistor is controlled to be grounded, the first switch, the second switch, the fifth switch, and the sixth switch are controlled to be in an open state, and the third switch and the fourth switch are controlled to be in a closed state; and a second step, the fifth switch and the sixth switch are controlled to be in the closed state.

According to some embodiments, the operation of controlling the fifth switch and the sixth switch to be in the closed state includes that: voltages at control terminals of the fifth switch and the sixth switch are controlled to gradually reduce the ON resistances of the fifth switch and the sixth switch.

In the technical solutions provided in some embodiments of the present disclosure, by configuring the sense amplifier as described above, it is possible to realize the offset compensation of the sense amplifier, solve a problem that data readout may be erroneous due to differences between the transistors, and improve the performance of the memory.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the description, serve to explain the principles of the disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
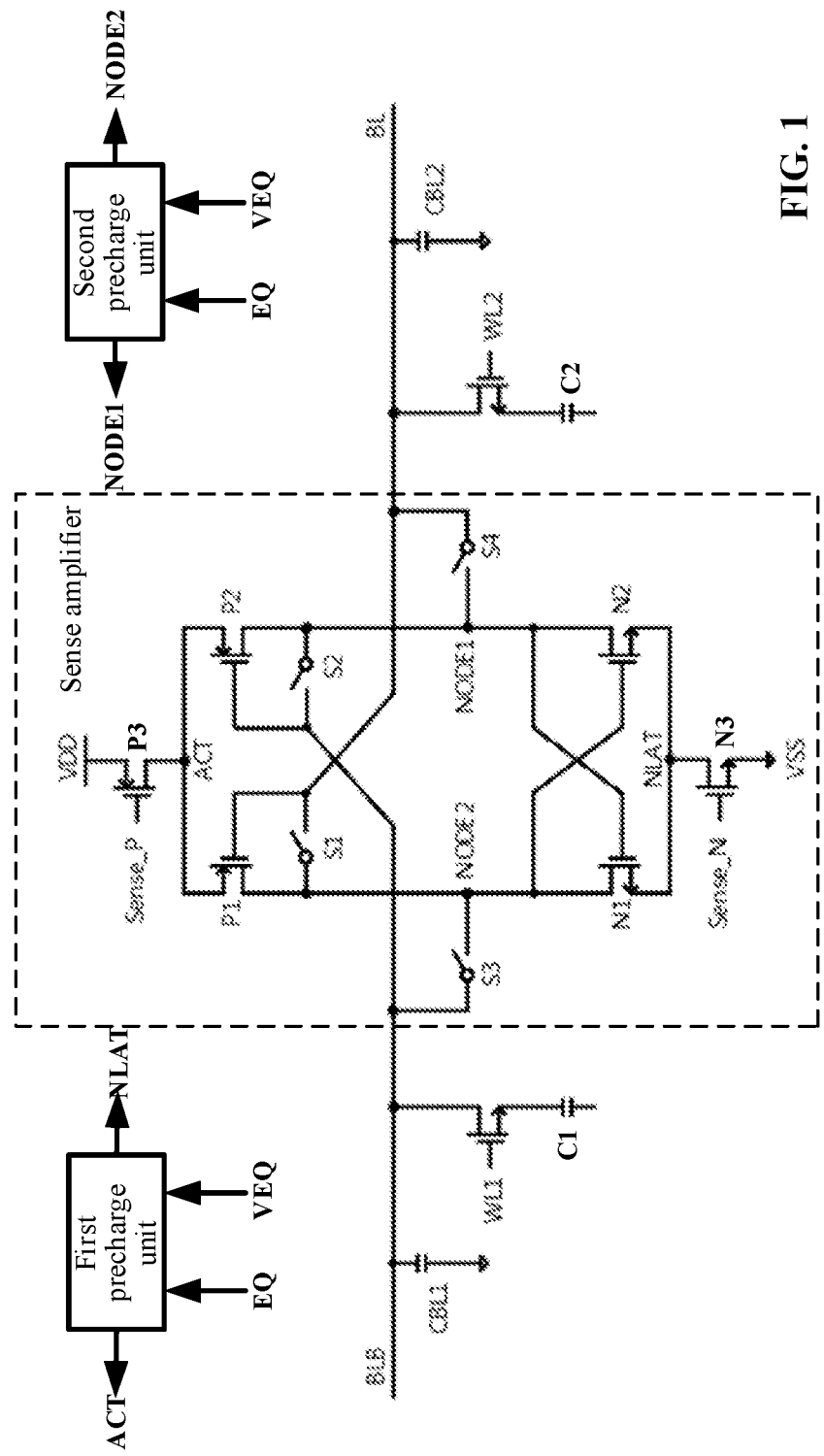
FIG. 1 schematically illustrates a circuit diagram of a sense amplifier according to an exemplary embodiment of the present disclosure.

The exemplary embodiment will now be described more fully with reference to the accompanying drawings. However, the exemplary embodiments can be implemented in variety of forms and should not be construed as limiting. Rather, the embodiments are provided so that the present disclosure will be thorough and complete and will fully convey the concepts of exemplary embodiments to those skilled in the art. The described features, structures or characteristics may be combined in one or more embodiment modes in any suitable manner. In the description below, numerous specific details are provided to give a sufficient understanding of the embodiment modes of the present disclosure. However, those skilled in the art will appreciate that the technical solutions of the present disclosure can be practiced while one or more of the specific details are omitted, or other methods, components, devices, steps, and the like may be employed. In other cases, the well-known technical solutions are not shown or described in detail to avoid supersedes what really counts, which cause aspects of the present disclosure to become obscure.

In addition, the accompanying drawings are merely schematic illustrations of the present disclosure and are not necessarily drawn to scale. The same reference numerals in the figures indicate the same or similar parts, and therefore repeated descriptions thereof will be omitted. The description of "first", "second", "third", "fourth", "fifth", "sixth" and "seventh" are for the purpose of distinction only and should not be taken as a limitation of the present disclosure.

It should be noted that the term "connection", as used in the present disclosure, may include direct connection and indirect connection. In the direct connection, there are no components between the ends. For example, a first end of a switch A is connected to a first end of a switch B, and there may be only a connection line (e.g., metal line) on the connection line between the first end of the switch A and the first end of the switch B, and no other components. In the indirect connection, there may be other components between the ends. For example, a first end of a switch C is connected to a first end of a switch D, and there may be at least one other component (e.g., switch E, etc.), in addition to the connection line, on the connection line between the first end of the switch C and the first end of the switch D.

In the sense amplifier, the sizes, mobilities, threshold voltages of the transistors may be different due to differences in manufacturing processes and influences of the operation environment, and the performances of transistors are usually not exactly the same, which may cause an offset of the sense amplifier. This is, offset noises are generated in the sense amplifier, which seriously affects the accuracy of data readout by a memory.

For example, the sense amplifier includes two NMOS transistors symmetrically configured. Ideally, the performances of the two NMOS transistors are expected to be exactly the same. However, in practice, the threshold voltages of the two NMOS transistors may be different, which may cause circuit offset. If no measure is taken at this time, when the data is readout from a memory cell, it is possible that the data "1" originally stored is read as data "0", and thus outputs the data "0" by mistake, or the data "0" originally stored is read as data "1", and thus outputs the data "1" by mistake.

To solve the technical problems, the present disclosure provides a new sense amplifier.

FIG. 1 schematically illustrates a circuit diagram of a sense amplifier according to an exemplary embodiment of the present disclosure.

The sense amplifier according to the exemplary embodiment of the present disclosure may include a first PMOS transistor (hereinafter referred to as transistor P1), a second PMOS transistor (hereinafter referred to as transistor P2), a first NMOS transistor (hereinafter referred to as transistor N1), a second NMOS transistor (hereinafter referred to as transistor N2), a first switch (hereinafter referred to as switch S1), a second switch (hereinafter referred to as switch S2), a third switch (hereinafter referred to as switch S3), and a fourth switch (hereinafter referred to as switch S4). The connection of the above-mentioned elements will be described in detail with reference to FIG. 1.

A gate of the transistor P1 is connected to the first bit line BL, and a gate of the transistor P2 is connected to the second bit line BLB. As depicted in FIG. 1, it will be readily understood by those skilled in the art that the second bit line BLB is an inverse bit line corresponding to the first bit line BL.

A source of transistor P1 is connected to a source of transistor P2. For the convenience of description, it can be considered that both the source of transistor P1 and the source of transistor P2 are connected to a node ACT.

A gate of transistor N1 is connected to a drain of transistor P2. For the convenience of description, it can be considered that both the gate of transistor N1 and the drain of transistor P2 are connected to a node NODE1. The drain of transistor N1 is connected to the drain of transistor P1. For the convenience of description, it can be considered that both the drain of transistor N1 and the drain of transistor P1 are connected to a node NODE2.

A gate of the transistor N2 is connected to a drain of the transistor P1, that is, the gate of the transistor N2 is connected to the node NODE2. A drain of the transistor N2 is connected to the drain of the transistor P2, that is, the drain of the transistor N2 is connected to the node NODE1.

A source of transistor N1 is connected to a source of transistor N2. For the convenience of description, it can be considered that both the source of transistor N1 and the source of transistor N2 are connected to a node NLAT.

A first end of the switch S1 is connected to the drain of the transistor P1, that is, the first end of the switch S1 is connected to the node NODE2. A second end of the switch S1 is connected to the gate of the transistor P1 and to the first bit line BL, that is, the second end of the switch S1 is also connected to the first bit line BL.

A first end of the switch S2 is connected to the drain of the transistor P2, that is, the first end of the switch S2 is connected to the node NODE1. A second end of the switch S2 is connected to the gate of the transistor P2 and to the second bit line BLB, that is, the second end of the switch S2 is also connected to the second bit line BLB.

A first end of the switch S3 is connected to the first end of the switch S1, that is, the first end of the switch S3 is connected to the node NODE2. A second end of the switch S3 is connected to the second end of the switch S2, that is, the second end of the switch S3 is connected to the second bit line BLB.

A first end of the switch S4 is connected to the first end of the switch S2, that is, the first end of the switch S4 is connected to the node NODE1. A second end of the switch S4 is connected to the second end of the switch S1, that is, the second end of the switch S4 is connected to the first bit line BL.

The present disclosure does not limit the types of the switch S1, the switch S2, the switch S3, and the switch S4. For example, the switch S1 may be a PMOS transistor, an NMOS transistor, or a CMOS transmission gate, the switch S2 may be a PMOS transistor, an NMOS transistor, or a CMOS transmission gate, the switch S3 may be a PMOS transistor, an NMOS transistor, or a CMOS transmission gate, and the switch S4 may be a PMOS transistor, an NMOS transistor, or a CMOS transmission gate. In this case, it will be readily understood by a person skilled in the art that the switch S1 to the switch S4 may include, in addition to the first end and the second end, a control terminal for controlling switch S1 to the switch S4 to be in the open/closed state.

In addition, the sense amplifier of the exemplary embodiment of the present disclosure further includes a pull-up unit and a pull-down unit. Herein, the pull-up unit is configured to connect the source of the transistor P1 to the power supply voltage VDD in response to the pull-up control signal, that is, the pull-up unit may connect the node ACT to the power supply voltage VDD. The pull-down unit is configured to ground the source of the transistor N1 (i.e., configured to connect the source of the transistor N1 to the VSS) in response to the pull-down control signal, that is, the pull-down unit may connect the node NLAT to the VSS.

In an embodiment of the present disclosure, the pull-up unit may include a pull-up PMOS transistor (hereinafter referred to as transistor P3), a gate of transistor P3 receives a pull-up control signal Sense_P (a control signal on which transistor P3 is turned on), a source of transistor P3 is connected to the power supply voltage VDD, and a drain of transistor P3 is connected to the node ACT.

In an embodiment of the present disclosure, the pull-down unit may include a pull-down NMOS transistor (hereinafter referred to as transistor N3), a gate of transistor N3 receives a pull-down control signal Sense_N (a control signal on which transistor N3 is turned on), a source of transistor N3 is grounded, and a drain of transistor N3 is connected to the node NLAT.

It should be understood that the formation of the pull-up unit with transistor P3 and the formation of the pull-down unit with transistor N3 are only one example of the present disclosure, and those skilled in the art may think of other implementations, for example, the pull-up unit may be implemented by using an NMOS transistor, the pull-down unit may be implemented by using a PMOS transistor, and the pull-up unit or the pull-down unit may include more than one device, or may include multiple devices that are controlled to be turned on or turned off through different control signals. However, in connection with the overall structure of the sense amplifier of the present disclosure, schemes for making the node ACT connectable to VDD and the node NLAT connectable to VSS are within the scope of the present disclosure.

In addition, the sense amplifier of the present disclosure may further include a first precharge unit and a second precharge unit.

The first precharge unit is configured to, in response to the precharge control signal, precharge the node ACT and the node NLAT in the case where the switch S1, the switch S2, the switch S3 and the switch S4 are all closed.

The second precharge unit is configured to, in response to the precharge control signal, precharge the first bit line BL, the second bit line BLB, the node NODE1, and the node NODE2 in the case where the switch S1, the switch S2, the switch S3 and the switch S4 are all closed.

Herein, the precharge voltage may be denoted as VEQ, and the precharge voltages VEQ output by the first precharge unit and the second precharge unit may be configured as VDD/2 or other voltage values.

It should be noted that the first precharge unit and the second precharge unit may be configured respectively, or the first precharge unit and the second precharge unit may be configured as a charging unit, inputs of the charging unit include a precharge control signal and a precharge voltage, and the charging unit includes a plurality of output ends connected to the node ACT, the node NLAT, the node NODE1, and the node NODE2, respectively. The present disclosure is not limited thereto.

Figure 2:
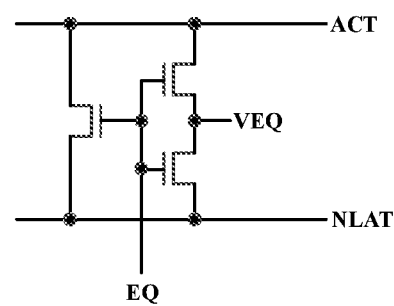
FIG. 2 schematically illustrates a circuit diagram of a first precharge unit according to an exemplary embodiment of the present disclosure.

FIG. 2 illustrates a circuit structure of a first precharge unit. Herein, a control terminal of the first precharge unit is configured to receive a control signal EQ to control a turned-on or turned-off state of each transistor in the first precharge unit to precharge the node ACT and the node NLAT. In a case where switch S1, switch S2, switch S3 and switch S4 are all closed, the node ACT and the node NLAT are precharged to VEQ.

The second precharge unit is similar in structure to the first precharge unit. The control terminal of the second precharging unit is also configured to receive the control signal EQ to control the turned-on or turned-off state of each transistor in the second precharging unit to precharge the node NODE1 and the node NODE2. In the case where switch S1, switch S2, switch S3 and switch S4 are all closed, the node NODE1 and the node NODE2 are precharged to VEQ.

In addition, the sense amplifier of the present disclosure may further include a switch control unit for controlling the switching states (i.e., closed and open) of the switch S1, the switch S2, the switch S3, and the switch S4 in response to the control signal.

The switch control unit may also output signals for controlling the switching states of the transistor P3 and the transistor N3, that is, the switch control unit may also output the pull-up control signal Sense_P and the pull-down control signal Sense_N.

The operation of performing data readout by the sense amplifier according to the exemplary embodiment of the present disclosure will be described below with reference to the flowchart of FIG. 3 and the depictions of FIGS. 4 to 12.

Figure 3:
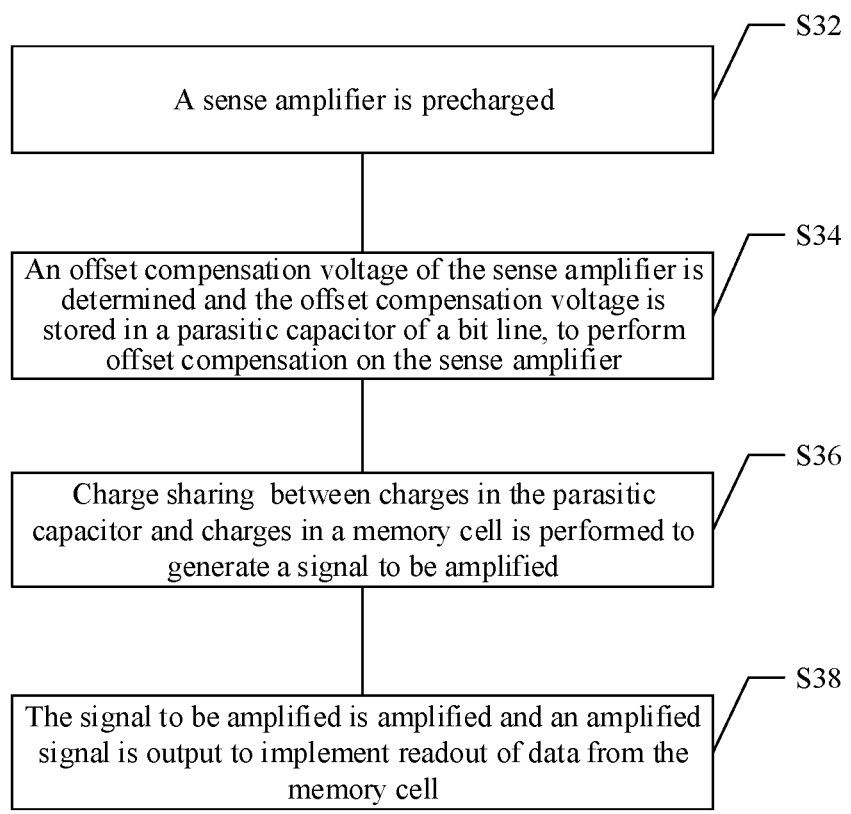
FIG. 3 schematically illustrates a flowchart of a data readout method according to an exemplary embodiment of the present disclosure.

Referring to FIG. 3, the present disclosure also provides a data readout method including the operations S32 to S38.

In operation S32, the sense amplifier is precharged.

Figure 4:
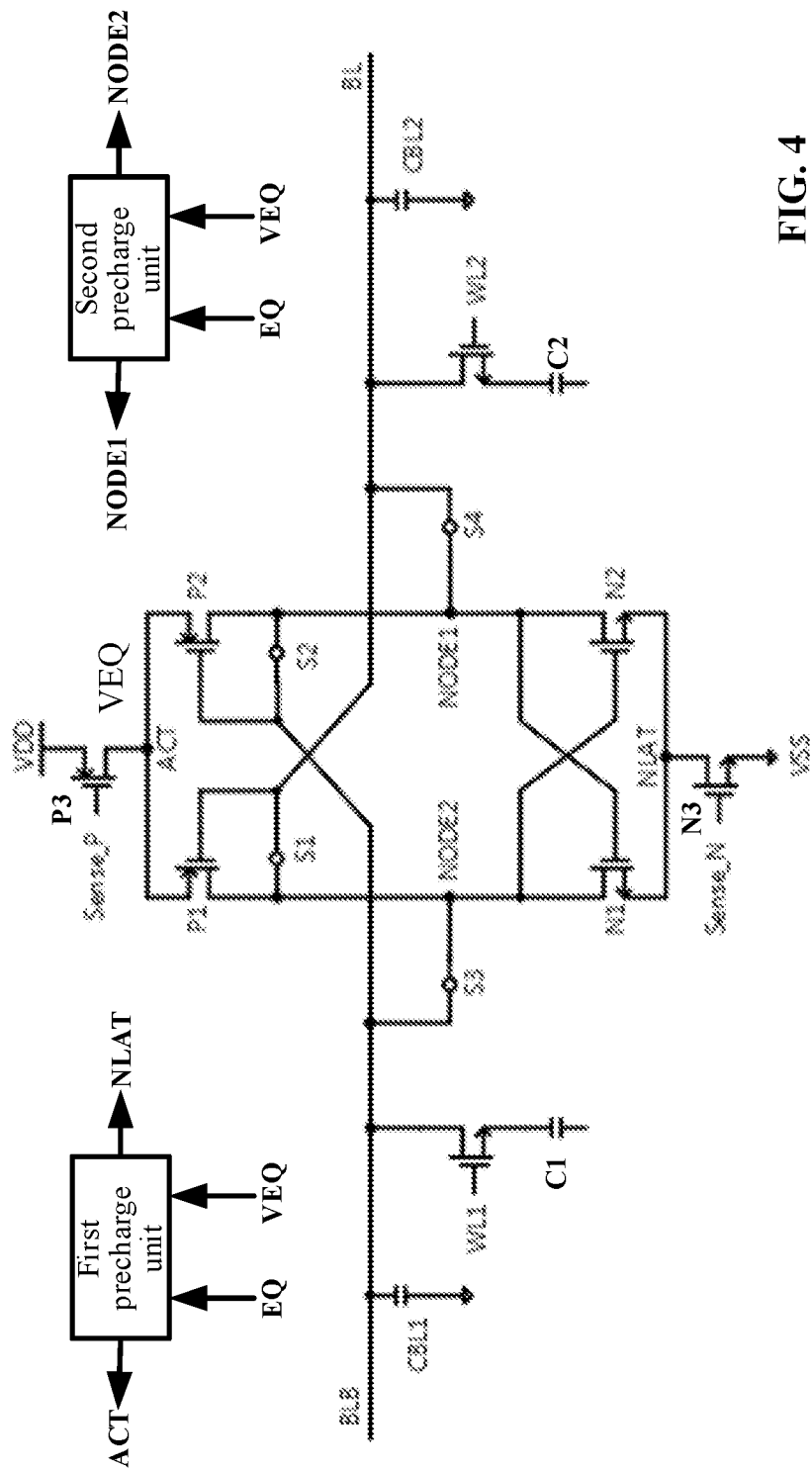
FIG. 4 schematically illustrates a circuit diagram of a sense amplifier during a precharge stage according to an exemplary embodiment of the present disclosure.

Referring to FIG. 4, the operation of precharging the sense amplifier includes that: the switch S1, the switch S2, the switch S3 and the switch S4 are controlled to be in the closed state, and the first bit line BL, the second bit line BLB, the node NODE1, the node NODE2, the node ACT, and the node NLAT are precharged.

Specifically, the node ACT and the node NLAT may be connected to the output end of the first precharge unit, and the first precharge unit outputs, in response to the precharge control signal EQ, the precharge voltage VEQ from the output end to realize precharging of the node ACT and the node NLAT.

The node NODE1 and the node NODE2 may be connected to the output end of the second precharge unit, and the second precharge unit outputs, in response to the precharge control signal EQ, the precharge voltage VEQ from the output end to realize precharging of the node NODE1 and the node NODE2, that is, realize precharging of the first bit line BL and the second bit line BLB.

It will be readily appreciated that during the precharge phase, transistor P3 and transistor N3 are turned off.

In operation S34, an offset compensation voltage of the sense amplifier is determined and the offset compensation voltage is stored in a parasitic capacitor of a bit line, to perform offset compensation on the sense amplifier.

Figure 5:
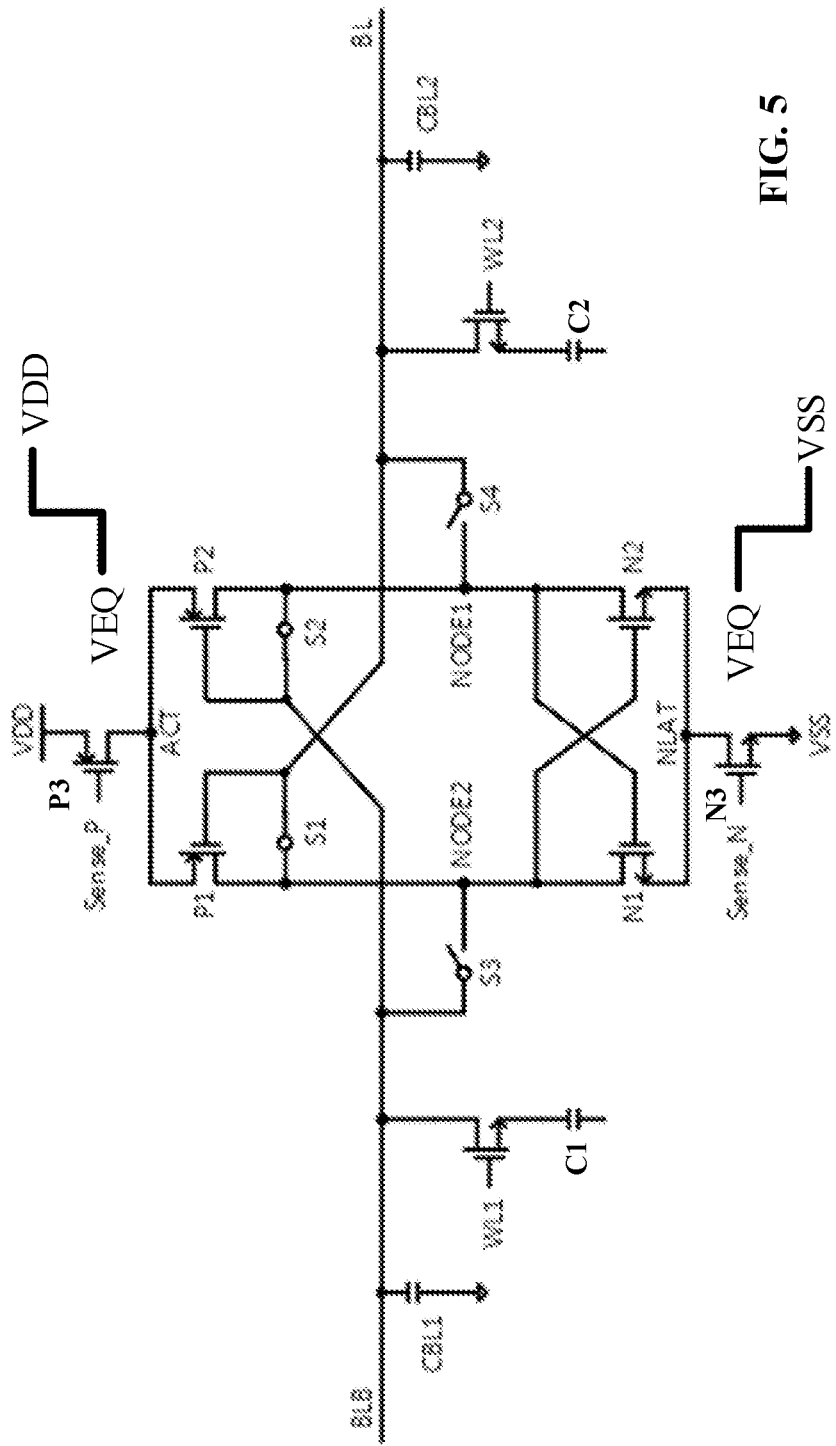
FIG. 5 schematically illustrates a circuit diagram of a sense amplifier during an offset compensation stage according to an exemplary embodiment of the present disclosure.

Referring to FIG. 5, during the compensation stage corresponding to operation S34, the switch S1 and the switch S2 are controlled to be in the closed state, and the switch S3 and the switch S4 are controlled to be in the open state. Thus, the transistor P1 and the transistor P2 are configured to be in a diode connection mode, and the transistor N1 and the transistor N2 are configured in a cross-coupled amplification mode.

In addition, the transistor P3 is controlled to be turned on to connect the node ACT to the power supply voltage VDD, and the transistor N3 is controlled to be turned on to ground the node NLAT.

In this case, due to the mismatch between the transistor P1, the transistor P2, the transistor N1 and the transistor N2, the offset compensation voltage Vos is generated between the first bit line BL and the second bit line BLB, and the offset compensation voltage Vos is stored in the parasitic capacitor of the bit line, that is, the offset compensation voltage Vos is stored in the parasitic capacitor CBL2 of the first bit line BL and/or the parasitic capacitor CBL1 of the second bit line BLB.

According to an exemplary embodiment of the present disclosure, transistor N1 and transistor N2 are configured to be in an amplification mode rather than the transistor P1 and the transistor P2 are configured to be in an amplification mode. Since the carriers in the channel of the NMOS are electrons and the carriers in the channel of the PMOS are holes, and the mobility of the electrons is much larger than the mobility of the holes, the amplification performed by using the transistor N1 and the transistor N2 can increase the speed at which the offset compensation voltage Vos is generated, thereby further improving the performance of the memory.

In operation S36, charge sharing between charges in the parasitic capacitor and charges in a memory cell is performed to generate a signal to be amplified.

Figure 6:
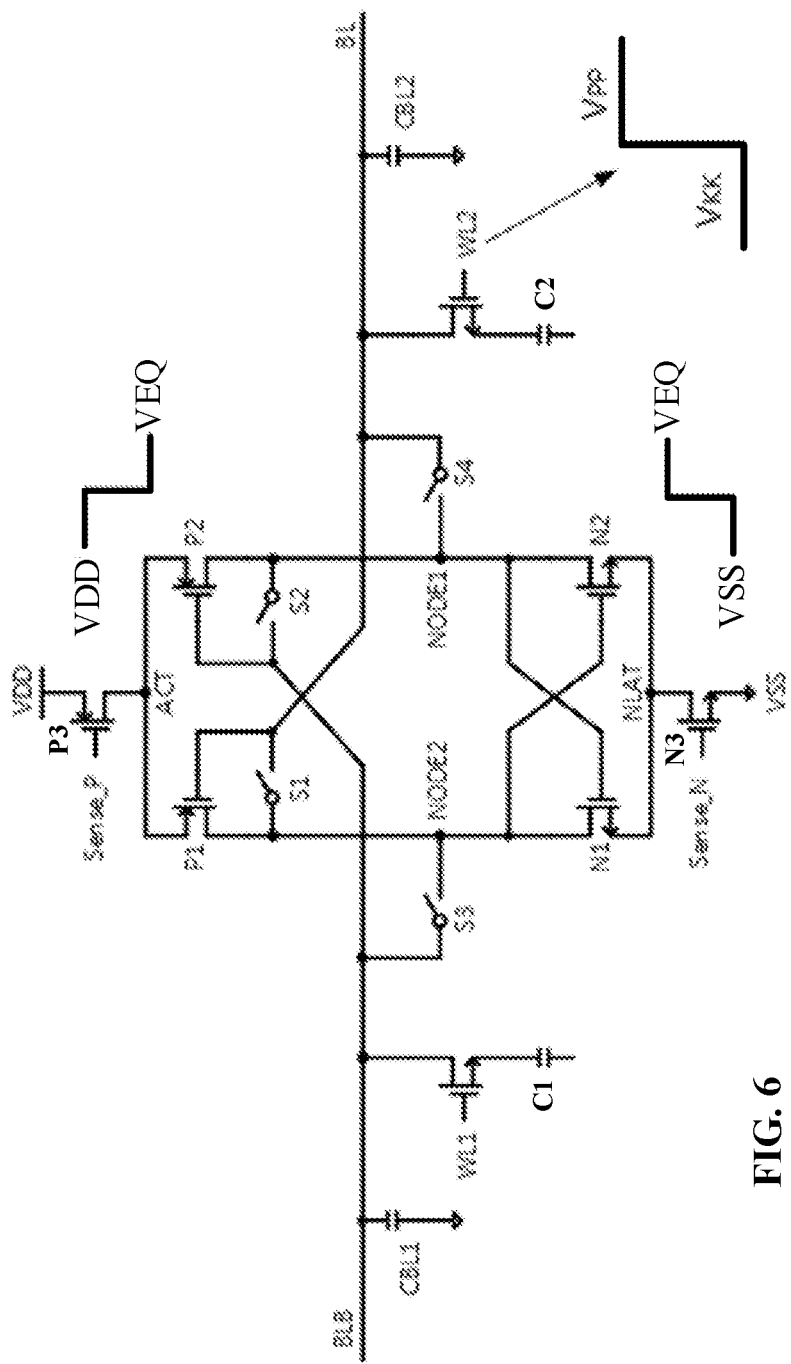
FIG. 6 schematically illustrates a circuit diagram of a sense amplifier during a charge sharing stage according to an exemplary embodiment of the present disclosure.

Referring to FIG. 6, during the charge sharing stage corresponding to operation S36, the switch S1, the switch S2, the switch S3, and the switch S4 are all controlled to be in the open state.

In addition, the transistor P3 and the transistor N3 are controlled to be turned off, and the node ACT and the node NLAT are charged to a precharge potential (i.e., VEQ).

In a case where the memory cell reads out the charge in response to the turn-on signal of the word line, charge sharing between the charges in the parasitic capacitor and the charges in the memory cell may be performed, to generate a signal to be amplified. It will be appreciated that the signal to be amplified is a small-signal input voltage, which is input to the sense amplifier of the present disclosure for amplification.

As shown in FIG. 6, when the control signal of the word line WL2 is changed from Vkk to Vpp, the transistor of the memory cell is turned on. At this time, charge sharing between the charges stored in the capacitor C2 and the charges stored in the parasitic capacitor CBL2 of the bit line BL may be performed.

Vkk is a relatively low voltage and may even be a negative voltage, e.g., −0.3~−0.1V. Vpp is a relatively high voltage, e.g., 2.5~3.2V.

When the transistor in the memory cell needs to be turned off, WL2 can be set to a lower voltage, so that the transistor can be turned off completely to avoid charge leakage in the capacitor C2 caused by sub-threshold leakage current. When the transistor in the memory cell needs to be turned on, WL2 can be set to a high voltage, so that the ON resistances of the transistor can be reduced to shorten the time required for reading or writing information.

In operation S38, the signal to be amplified is amplified and an amplified signal is output to implement readout of data from the memory cell.

In an exemplary embodiment of the present disclosure, the operation of amplifying the signal to be amplified may include a first operation and a second operation.

Figure 7:
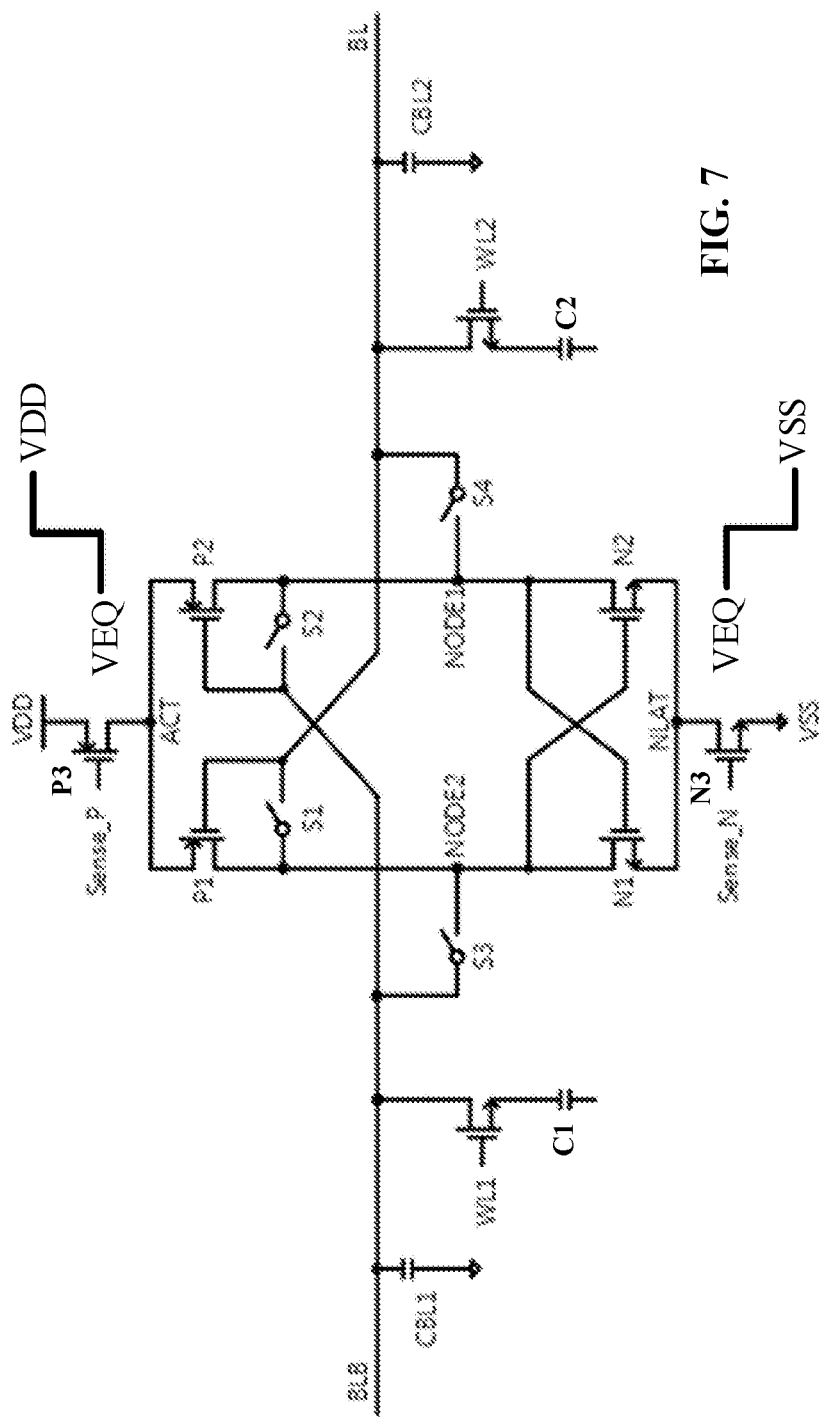
FIG. 7 schematically illustrates a circuit diagram of a sense amplifier during a pre-amplification stage according to an exemplary embodiment of the present disclosure.

In the first operation, referring to FIG. 7, an open state of the switch S1, the switch S2, the switch S3, and the switch S4 is kept. The transistor P3 is controlled to be turned on to connect the node ACT with the power supply voltage VDD and the transistor N3 is controlled to be turned on to ground the node NLAT.

In this case, since NODE1 and NODE2 are not connected to the parasitic capacitor CBL1 or CBL2 on the bit line, the signal to be amplified is rapidly amplified, and the voltage on the node NODE1 and the node NODE2 is rapidly separated. It will be understood that the operation achieves voltage amplification between node NODE1 and node NODE2.

Figure 8:
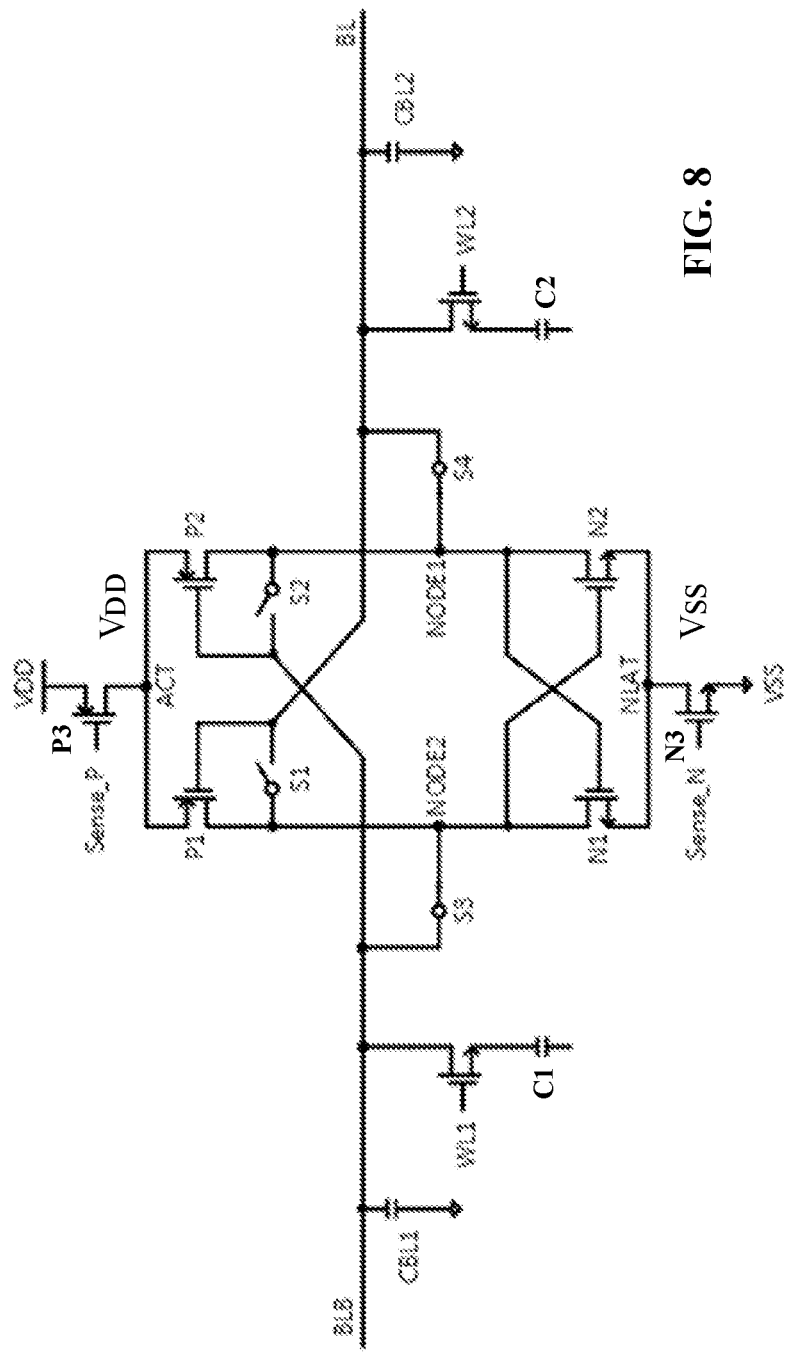
FIG. 8 schematically illustrates a circuit diagram of a sense amplifier during a write-back stage according to an exemplary embodiment of the present disclosure.

In the second operation, referring to FIG. 8, the state in which the node ACT is connected to the power supply voltage and the node NLAT is grounded is kept, and the switch S3 and the switch S4 are controlled to be closed. At this time, the first bit line BL is connected to the node NODE1, and the second bit line BLB is connected to the node NODE2, so that the write-back of the first bit line BL and the second bit line BLB is realized. That is, separation and amplification of signals on the first bit line BL and the second bit line are realized to complete data readout from the memory cell.

It needs to be noted that the first operation may be referred to as a pre-amplification process, and the second operation may be referred to as a write-back process. In addition, the process of the first operation described above may be omitted, that is, the switch S3 and the switch S4 are directly controlled to be closed to simplify the timing.

In addition, the process of closing the switch S3 and the switch S4 described above may be a slow closing process. That is, the ON resistances of the switch S3 and the switch S4 can be gradually reduced by controlling the voltages at the control terminals of the switch S3 and the switch S4, rather than a rapid closing process in an ideal case. Thus, it is avoided that when the switch S3 and the switch S4 are closed, the voltages that have been distinguished between the node NODE1 and the node NODE2 becomes close again due to the access of the parasitic capacitor of the bit line, causing a failure of the signal separation and amplification process. By the operation of slowly closing the switch, data write-back can be realized more quickly and reliably, thereby enhancing the robustness of the entire process.

Figure 9:
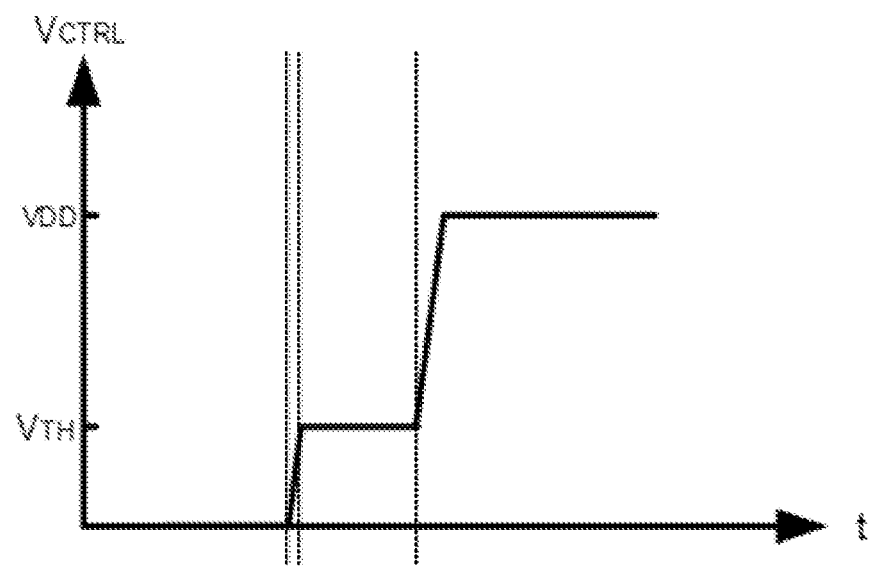
FIG. 9 shows a schematic diagram of changes in control terminal voltage of a switch S3 and a switch S4 during a write-back stage according to an exemplary embodiment of the present disclosure.

FIG. 9 shows a schematic diagram of changes of voltages at the control terminal of the switch S3 and the switch S4.

For example, when the switch S3 is an NMOS transistor, the voltage at the control terminal of the switch S3 is $V_{CTRL}$, and when the closing operation starts, $V_{CTRL}$ will be increased, and when $V_{CTRL}$ is increased to the threshold voltage $V_{TH}$ of the switch S3, $V_{CTRL}$ may remain unchanged for a predetermined time period, and then $V_{CTRL}$ continues to be increased to VDD. Similarly, the switch S4 may be slowly closed in this manner.

It should be noted that FIG. 9 is only an exemplary description, on the one hand, it is also possible that the $V_{CTRL}$ can be maintained for a predetermined time period in the vicinity of $V_{TH}$, for example in the range of $V_{TH} \pm \sigma$, where σ is a small voltage value. On the other hand, $V_{CTRL}$ may be slowly increased in the form of a curve. The present disclosure does not limit the process of slowly closing switch S3 and switch S4.

Figure 10:
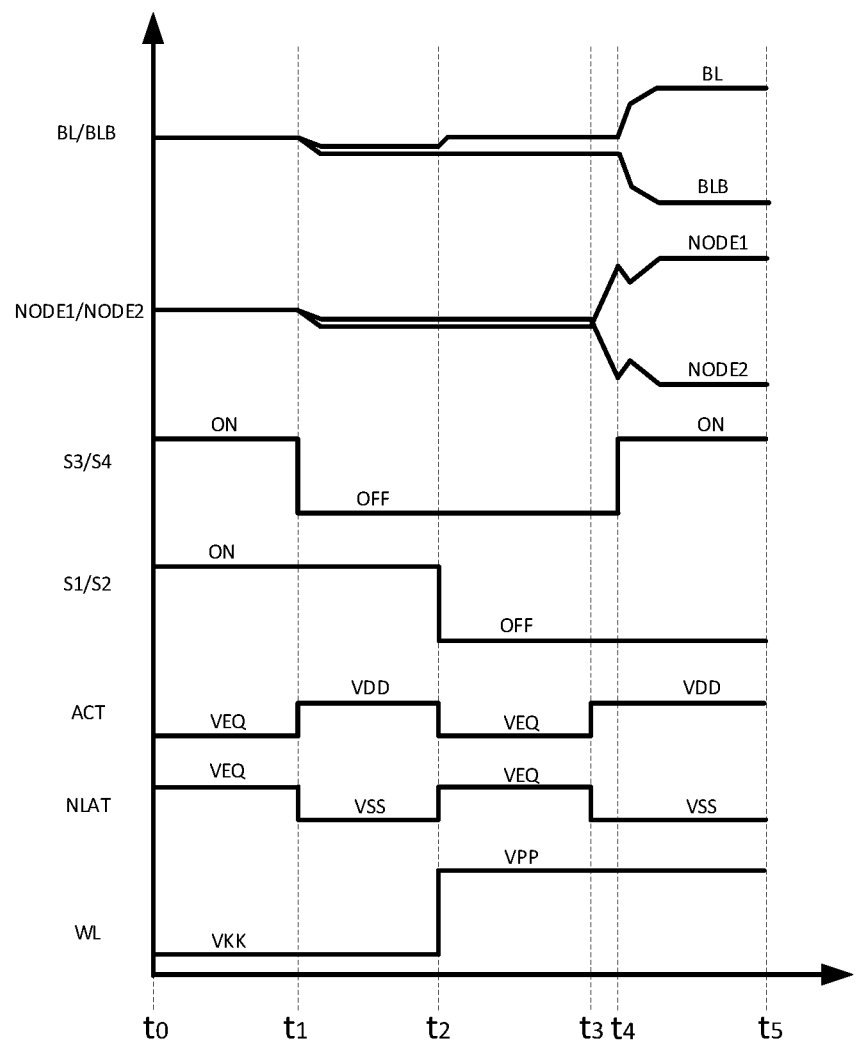
FIG. 10 schematically illustrates a timing diagram of a sense amplifier according to an exemplary embodiment of the present disclosure.

FIG. 10 shows a circuit timing diagram corresponding to the above operations S32 to S38. In FIG. 10, the abscissa represents time, the ordinate represents signal level, and takes the data "1" stored in the memory cell as an example.

The time interval $t_0$-$t_1$ corresponds to the precharge stage of the sense amplifier. In this case, the switch S1, the switch S2, the switch S3, and the switch S4 are all in the closed state (denoted as ON). The node ACT, the node NLAT, the first bit line BL, and the second bit line BLB are charged to VEQ.

The time interval $t_1$-$t_2$ corresponds to the offset compensation stage of the sense amplifier. In this case, the transistor P1 and the transistor P2 are configured to be in the diode connection mode, and the transistor N1 and the transistor N2 are configured in the cross-coupled amplification mode. Specifically, the closed state of the switch S1 and the switch S2 can be maintained, the switch S3 and the switch S4 are opened (denoted as OFF), the node ACT is connected to the power supply voltage VDD, and the node NLAT is grounded.

The time interval $t_2$-$t_3$ corresponds to the charge sharing stage of the sense amplifier. In this case, the switch S1 and the switch S2 are also opened, and the node ACT and the node NLAT are set to VEQ. In addition, the word line WL (for example, the WL2 described above) changes from VKK to VPP to read out the charge of the memory cell. Thus, a small signal to be amplified is generated.

The time interval $t_3$-$t_4$ corresponds to the pre-amplification stage of the sense amplifier. In this case, the transistor P1 and the transistor P2 are configured to be in a signal to be amplified receiving mode for receiving the small signal to be amplified generated in the charge sharing stage. Specifically, the switch S1, the switch S2, the switch S3, and the switch S4 can be maintained in an open state, the node ACT is connected to the power supply voltage VDD and the node NLAT is grounded. At this time, the voltages at the node NODE1 and the node NODE2 are rapidly separated and amplified.

The time interval $t_4$-$t_5$ corresponds to the write-back stage of the sense amplifier. In this case, the transistor P1 and the transistor N1 are configured as a first inverter, and the transistor P2 and the transistor N2 are configured as a second inverter, where the first inverter and the second inverter are configured to be in a latch mode. Specifically, the switch S3 and the switch S4 can be closed, and the remaining configurations are unchanged. As described above, the process of closing the switch S3 and the switch S4 may be a slowly closing process. Thus, separation and amplification of the voltages on the first bit line BL and the second bit line BLB are realized, and data readout is realized.

In order to make the pre-amplification process described above faster, another sense amplifier is provided in another exemplary embodiment of the present disclosure.

The sense amplifier circuit may include a fifth switch and a sixth switch in addition to the transistors and the switches above.

Specifically, a first end of the fifth switch can be connected to the second end of the third switch, a second end of the fifth switch can be connected to the second bit line BLB. A first end of the sixth switch can be connected to the second end of the fourth switch, and a second end of the sixth switch can be connected to the first bit line BL.

For the circuit working process of the above operations S32 to S38, in the operations S32, S34 and S36, the fifth switch and the sixth switch are all in the closed state, and the process is similar and will not be described again.

Figure 11:
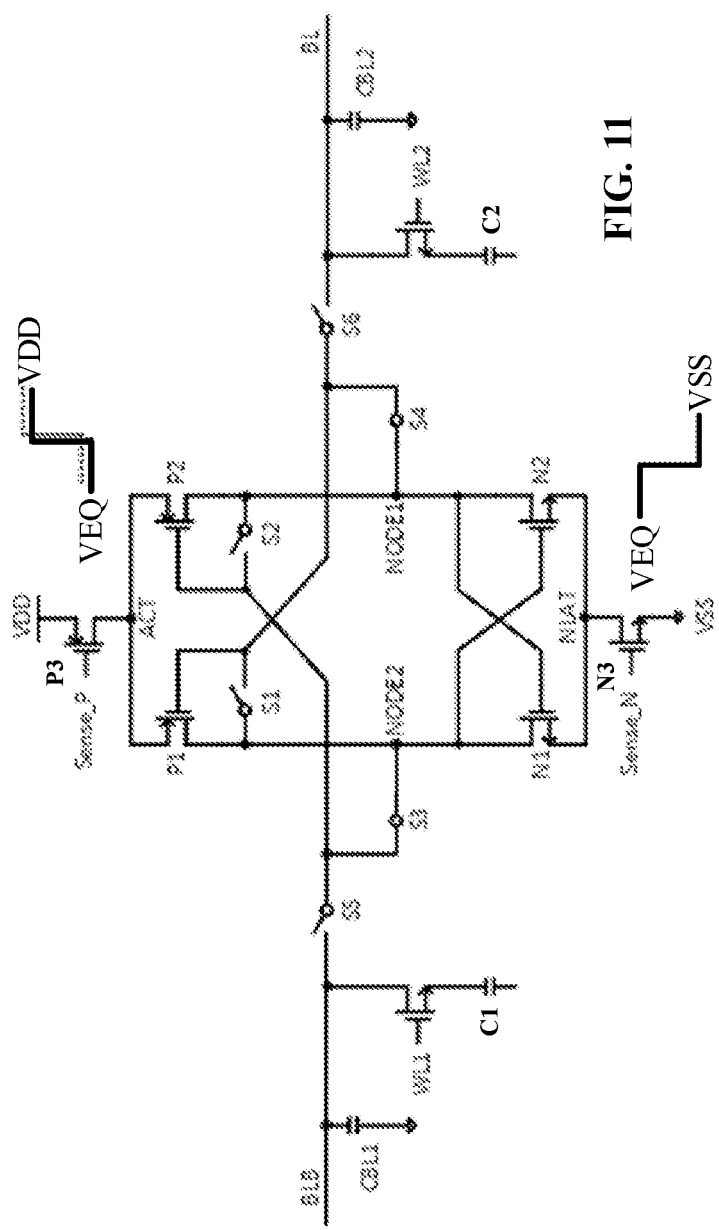
FIG. 11 schematically illustrates a circuit diagram of a sense amplifier during a pre-amplification stage according to another exemplary embodiment of the present disclosure.

For the pre-amplification process and the write-back process in operation S38 above, FIG. 11 schematically shows a circuit diagram of a sense amplifier including the fifth switch and the sixth switch. The fifth switch may be simply referred to as the switch S5, and the sixth switch may be simply referred to as the switch S6. In addition, the switch S5 may be a PMOS transistor, an NMOS transistor, or a CMOS transmission gate, and the switch S6 may be a PMOS transistor, an NMOS transistor, or a CMOS transmission gate.

The operations of amplifying the signal to be amplified may also include a first operation and a second operation.

In the first operation, referring to FIG. 11, the switch S1, the switch S2, the switch S5, and the switch S6 are controlled to be in an open state, and the switch S3 and the switch S4 are controlled to be in a closed state. The transistor P3 is controlled to turned on to connect the node ACT to the power supply voltage VDD, and the transistor N3 is control to be turned on to ground the node NLAT.

In this case, the transistor P1 and the transistor P2 are also configured to be in an amplification mode, and the transistor P1 and the transistor N1 form a CMOS inverter, and the transistor P2 and the transistor N2 also form a CMOS inverter, and the two inverters are configured to be in a cross-coupled latch form, so that a maximum equivalent transconductance can be obtained by such a configuration, thereby increasing the amplification speed of the signal to be amplified and shortening the time of signal reading.

In the second operation, during the write-back stage, the separation and the amplification of signals on the first bit line BL and the second bit line BLB can be realized only by closing the switch S5 and the switch S6.

In addition, the process of closing the switch S5 and the switch S6 may be a slow closing process. Specifically, the ON resistances of the switch S5 and the switch S6 can be gradually reduced by controlling the voltages at the control terminals of the switch S5 and the switch S6. The operation process is similar to the operation process of slowly closing the switch S3 and the switch S4 described above, and details are not described herein.

Figure 12:
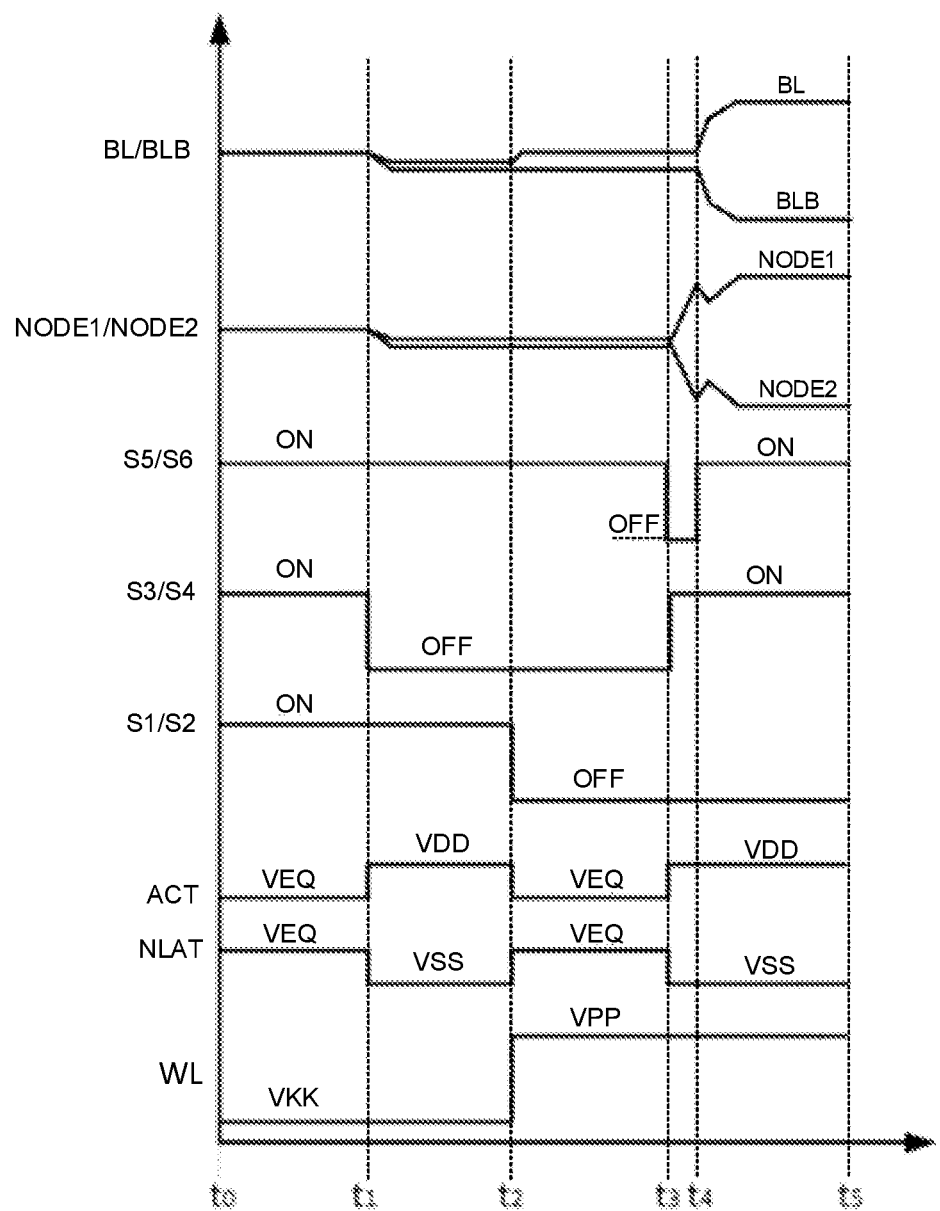
FIG. 12 schematically illustrates a timing diagram of a sense amplifier according to another exemplary embodiment of the present disclosure.

FIG. 12 shows a timing diagram of a sense amplifier including the switch S5 and the switch S6.

The timing part corresponding to the time interval $t_0$-$t_3$ in FIG. 12 is the same as the timing part corresponding to the time interval $t_0$-$t_3$ in FIG. 10, and will not be described again.

As shown in FIG. 12, the time interval $t_3$-$t_4$ corresponds to the pre-amplification stage of the sense amplifier. In this case, the transistor P1 and the transistor N1 are configured as a first inverter, and the transistor P2 and the transistor N2 are configured as a second inverter, where the first inverter and the second inverter are configured to be in a latch mode.

Specifically, the switch S1, the switch S2, the switch S5, and the switch S6 are controlled to be opened, the switch S3 and the switch S4 are controlled to be closed, the node ACT is connected to the power supply voltage VDD, and the node NLAT is grounded. At this time, the voltages at the node NODE1 and the node NODE2 are rapidly separated and amplified, and the speed is faster than that shown in FIG. 10 (the slope of the change is larger), thereby further improving the speed at which the memory reads data and improving the performance of the memory.

As shown in FIG. 12, the time interval $t_4$-$t_5$ corresponds to the write-back phase of the sense amplifier. In this case, the switch S5 and the switch S6 are closed, and the remaining configurations are unchanged. Thus, separation and amplification of the voltages on the first bit line BL and the second bit line BLB are realized, and data readout is realized.

Based on the sense amplifier of the exemplary embodiments of the present disclosure and the data readout process realized by using the sense amplifier, the offset compensation of the sense amplifier can be realized, which solves a problem that data readout may be erroneous due to differences between transistors, and improves the performance of the memory.

Further, the present disclosure provides a memory including the above-described sense amplifier.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be understood that the present invention is not limited to the exact construction that has been described above and illustrated in the accompanying drawings, and that various modifications and changes can be made without departing from the scope thereof. It is intended that the scope of the invention only be limited by the appended claims.

The invention claimed is:
1. A sense amplifier, comprising:
a first positive channel metal oxide semiconductor (PMOS) transistor, a gate of the first PMOS transistor being connected to a first bit line;
a second PMOS transistor, a gate of the second PMOS transistor being connected to a second bit line, and a source of the second PMOS transistor being connected to a source of the first PMOS transistor, wherein the second bit line is an inverse bit line corresponding to the first bit line;
a first negative channel metal oxide semiconductor (NMOS) transistor, a gate of the first NMOS transistor being connected to a drain of the second PMOS transistor, and a drain of the first NMOS transistor being connected to a drain of the first PMOS transistor; and
a second NMOS transistor, a gate of the second NMOS transistor being connected to the drain of the first PMOS transistor, a drain of the second NMOS transistor being connected to the drain of the second PMOS transistor, and a source of the second NMOS transistor being connected to a source of the first NMOS transistor,
wherein during an offset compensation stage of the sense amplifier, the first PMOS transistor and the second PMOS transistor are configured to be in a diode connection mode, and the first NMOS transistor and the second NMOS transistor are configured to be in a cross-coupled amplification mode,
wherein during a pre-amplification stage of the sense amplifier, the first PMOS transistor and the second PMOS transistor are configured to be in a signal to be amplified receiving mode for receiving the signal to be amplified and the first NMOS transistor and the second NMOS transistor are configured in the cross-coupled amplification mode, the signal to be amplified being generated by charge sharing between charges in a parasitic capacitor of the first bit line or the second bit line and charges in a corresponding memory cell,
wherein during a write-back stage of the sense amplifier, the first PMOS transistor and the first NMOS transistor are configured as a first inverter, the second PMOS transistor and the second NMOS transistor are configured as a second inverter, and the first inverter and the second inverter are configured to be in a latch mode, and
wherein the sense amplifier further comprises:
a first switch, a first end of the first switch being connected to the drain of the first PMOS transistor, and a second end of the first switch being connected to the gate of the first PMOS transistor;
a second switch, a first end of the second switch being connected to the drain of the second PMOS transistor, and a second end of the second switch being connected to the gate of the second PMOS transistor;
a third switch, a first end of the third switch being connected to the first end of the first switch, and a second end of the third switch being connected to the second end of the second switch; and
a fourth switch, a first end of the fourth switch being connected to the first end of the second switch, and a second end of the fourth switch being connected to the second end of the first switch.

2. The sense amplifier of claim 1, wherein during the offset compensation stage of the sense amplifier, the first switch and the second switch are closed, and the third switch and the fourth switch are open;
during the pre-amplification stage of the sense amplifier, the first switch, the second switch, the third switch and the fourth switch are all open; and
during the write-back stage of the sense amplifier, the first switch and the second switch are open, and the third switch and the fourth switch are closed.

3. The sense amplifier of claim 1, further comprising:
a pull-up circuit, configured to connect the source of the first PMOS transistor to a power supply voltage in response to a pull-up control signal; and
a pull-down circuit, configured to ground the source of the first NMOS transistor in response to a pull-down control signal.

4. The sense amplifier of claim 3, wherein the pull-up circuit comprises a pull-up PMOS transistor, a gate of the pull-up PMOS transistor being configured to receive the pull-up control signal, a source of the pull-up PMOS transistor being connected to the power supply voltage, and a drain of the pull-up PMOS transistor being connected to the source of the first PMOS transistor; and
the pull-down circuit comprises a pull-down NMOS transistor, a gate of the pull-down NMOS transistor being configured to receive the pull-down control signal, a source of the pull-down NMOS transistor being grounded, and a drain of the pull-down NMOS transistor being connected to the source of the first NMOS transistor.

5. The sense amplifier of claim 1, further comprising:
a first precharge circuit, configured to, in response to a precharge control signal, precharge the source of the first PMOS transistor and the source of the first NMOS transistor in a case where the first switch, the second switch, the third switch and the fourth switch are all closed; and
a second precharge circuit, configured to, in response to the precharge control signal, precharge the first bit line and the second bit line in the case where the first switch, the second switch, the third switch and the fourth switch are all closed.

6. The sense amplifier of claim 1, further comprising:
a switch control circuit, configured to control switching states of the first switch, the second switch, the third switch and the fourth switch in response to a control signal.

7. The sense amplifier of claim 1, further comprising:
a fifth switch, a first end of the fifth switch being connected to the second end of the third switch, and a second end of the fifth switch being connected to the second bit line; and
a sixth switch, a first end of the sixth switch being connected to the second end of the fourth switch, and a second end of the sixth switch being connected to the first bit line.

8. A sense amplifier of claim 7, wherein a type of the first switch is a PMOS transistor, an NMOS transistor or a complementary metal oxide semiconductor (CMOS) transmission gate;
a type of the second switch is a PMOS transistor, an NMOS transistor, or a CMOS transmission gate;
a type of the third switch is a PMOS transistor, an NMOS transistor, or a CMOS transmission gate;
a type of the fourth switch is a PMOS transistor, an NMOS transistor, or a CMOS transmission gate;
a type of the fifth switch is a PMOS transistor, an NMOS transistor, or a CMOS transmission gate; and
a type of the sixth switch is a PMOS transistor, an NMOS transistor, or a CMOS transmission gate.

9. A memory, comprising a sense amplifier, and the sense amplifier comprising:
a first positive channel metal oxide semiconductor (PMOS) transistor, a gate of the first PMOS transistor being connected to a first bit line;
a second PMOS transistor, a gate of the second PMOS transistor being connected to a second bit line, and a source of the second PMOS transistor being connected to a source of the first PMOS transistor, wherein the second bit line is an inverse bit line corresponding to the first bit line;
a first negative channel metal oxide semiconductor (NMOS) transistor, a gate of the first NMOS transistor being connected to a drain of the second PMOS transistor, and a drain of the first NMOS transistor being connected to a drain of the first PMOS transistor; and
a second NMOS transistor, a gate of the second NMOS transistor being connected to the drain of the first PMOS transistor, a drain of the second NMOS transistor being connected to the drain of the second PMOS transistor, and a source of the second NMOS transistor being connected to a source of the first NMOS transistor,
wherein during an offset compensation stage of the sense amplifier, the first PMOS transistor and the second PMOS transistor are configured to be in a diode connection mode, and the first NMOS transistor and the second NMOS transistor are configured to be in a cross-coupled amplification mode,
wherein during a pre-amplification stage of the sense amplifier, the first PMOS transistor and the second PMOS transistor are configured to be in a signal to be amplified receiving mode for receiving the signal to be amplified and the first NMOS transistor and the second NMOS transistor are configured in the cross-coupled amplification mode, the signal to be amplified being generated by charge sharing between charges in a parasitic capacitor of the first bit line or the second bit line and charges in a corresponding memory cell,
wherein during a write-back stage of the sense amplifier, the first PMOS transistor and the first NMOS transistor are configured as a first inverter, the second PMOS transistor and the second NMOS transistor are configured as a second inverter, and the first inverter and the second inverter are configured to be in a latch mode, and wherein the sense amplifier further comprises:
 a first switch, a first end of the first switch being connected to the drain of the first PMOS transistor, and a second end of the first switch being connected to the gate of the first PMOS transistor;
 a second switch, a first end of the second switch being connected to the drain of the second PMOS transistor, and a second end of the second switch being connected to the gate of the second PMOS transistor;
 a third switch, a first end of the third switch being connected to the first end of the first switch, and a second end of the third switch being connected to the second end of the second switch; and
 a fourth switch, a first end of the fourth switch being connected to the first end of the second switch, and a second end of the fourth switch being connected to the second end of the first switch.

10. A data readout method, applied to the sense amplifier of claim 1, the data readout method comprising:
 precharging the sense amplifier;
 determining an offset compensation voltage of the sense amplifier and storing the offset compensation voltage in the parasitic capacitor of the first bit line or the second bit line, to perform offset compensation on the sense amplifier;
 performing the charge sharing between the charges in the parasitic capacitor and charges in the corresponding memory cell to generate the signal to be amplified; and
 amplifying the signal to be amplified and outputting an amplified signal to implement readout of data from the corresponding memory cell.

11. The data readout method of claim 10, wherein the operation of precharging the sense amplifier comprises:
 controlling the first switch, the second switch, the third switch and the fourth switch to be in a closed state, and precharging the first bit line, the second bit line, the source of the first PMOS transistor and the source of the first NMOS transistor.

12. The data readout method of claim 10, wherein the operation of storing the offset compensation voltage of the sense amplifier in the parasitic capacitor of the first bit line or the second bit line comprises:
 controlling the first switch and the second switch to be in a closed state;
 controlling the third switch and the fourth switch to be in an open state;
 controlling the source of the first PMOS transistor to be connected to a power supply voltage; and
 controlling the source of the first NMOS transistor to be grounded.

13. The data readout method of claim 10, wherein the operation of performing the charge sharing between the charges in the parasitic capacitor and charges in the corresponding memory cell comprises:
 controlling the source of the first PMOS transistor and the source of the first NMOS transistor to be charged to a precharge potential; and
 controlling the first switch, the second switch, the third switch and the fourth switch to be in an open state,
 wherein in a case where the corresponding memory cell reads out the charges in response to a turn-on signal for a word line, the charge sharing is performed between the charges in the parasitic capacitor and the charges in the corresponding memory cell.

14. The data readout method of claim 10, wherein the operation of amplifying the signal to be amplified and outputting the amplified signal comprises:
 a first step of controlling the source of the first PMOS transistor to be connected to a power supply voltage, controlling the source of the first NMOS transistor to be grounded, and controlling the first switch, the second switch, the third switch and the fourth switch to be in an open state; and
 a second step of controlling the third switch and the fourth switch to be in a closed state.

15. The data readout method of claim 10, wherein the operation of amplifying the signal to be amplified and outputting the amplified signal comprises:
 controlling the source of the first PMOS transistor to be connected to a power supply voltage, and controlling the source of the first NMOS transistor to be grounded; and
 controlling the first switch and the second switch to be in an open state, and controlling the third switch and the fourth switch to be in a closed state.

16. The data readout method of claim 14, wherein the operation of controlling the third switch and the fourth switch to be in the closed state comprises:
 controlling voltages at control terminals of the third switch and the fourth switch to gradually reduce ON resistances of the third switch and the fourth switch.

17. The data readout method of claim 10, wherein the sense amplifier further comprises a fifth switch and a sixth switch, a first end of the fifth switch being connected to the second end of the third switch, a second end of the fifth switch being connected to the second bit line, a first end of the sixth switch being connected to the second end of the fourth switch, and a second end of the sixth switch being connected to the first bit line, wherein the operation of amplifying the signal to be amplified and outputting the amplified signal comprises:
 a first step of controlling the source of the first PMOS transistor to be connected to a power supply voltage, controlling the source of the first NMOS transistor to be grounded, controlling the first switch, the second switch, the fifth switch, and the sixth switch to be in an open state, and controlling the third switch and the fourth switch to be in a closed state; and
 a second step of controlling the fifth switch and the sixth switch to be in the closed state;
 wherein the operation of controlling the fifth switch and the sixth switch to be in the closed state comprises:
 controlling voltages at control terminals of the fifth switch and the sixth switch to gradually reduce ON resistances of the fifth switch and the sixth switch.

* * * * *